United States Patent
Ko

(10) Patent No.: US 7,373,626 B2
(45) Date of Patent: May 13, 2008

(54) METHOD AND TIMING HARNESS FOR SYSTEM LEVEL STATIC TIMING ANALYSIS

(75) Inventor: Robin Wan Lung Ko, Santa Clara, CA (US)

(73) Assignee: LSI Logic Corporation

( * ) Notice: Subject to any disclaimer, the term of this patent is extended or adjusted under 35 U.S.C. 154(b) by 246 days.

(21) Appl. No.: 11/006,349

(22) Filed: Dec. 6, 2004

(65) Prior Publication Data

US 2006/0123281 A1    Jun. 8, 2006

(51) Int. Cl.
G06F 17/50    (2006.01)
(52) U.S. Cl. .............................................. 716/6; 716/5
(58) Field of Classification Search ................ 716/4–6, 716/2, 18
See application file for complete search history.

(56) References Cited

U.S. PATENT DOCUMENTS

| | | | |
|---|---|---|---|
| 6,185,723 B1* | 2/2001 | Burks et al. .................... | 716/6 |
| 6,760,894 B1* | 7/2004 | Yalcin et al. ................... | 716/6 |
| 6,954,915 B2* | 10/2005 | Batchelor ...................... | 716/6 |
| 7,103,863 B2* | 9/2006 | Riepe et al. .................... | 716/7 |
| 7,114,111 B2* | 9/2006 | Noy ............................. | 714/738 |
| 7,134,106 B2* | 11/2006 | Huang et al. ................... | 716/4 |
| 2003/0196182 A1* | 10/2003 | Hahn ............................. | 716/6 |
| 2004/0025123 A1* | 2/2004 | Angilivelil ..................... | 716/4 |
| 2005/0198601 A1* | 9/2005 | Kuang et al. ................... | 716/6 |

OTHER PUBLICATIONS

Hui Fu; Static Timing Verification for Complex SoC Design—Part I DDR SDRAM Timing Check in Primetime Revisit; SNUG Singapore 2002; pp. 1-54; Infineon Technologies Asia Pacific, Singapore Design Center Microcontroller Dept., 168 Kallang Way, Singapore 349253.

* cited by examiner

Primary Examiner—Jack Chiang
Assistant Examiner—Binh Tat
(74) Attorney, Agent, or Firm—Eric J. Whitesell

(57) ABSTRACT

A method and computer program product for predicting quiescent current variation of an integrated circuit die include steps of: (a) receiving as input a system design including a design under timing analysis, an external device, and an interface between the design under timing analysis and the external device; (b) generating a timing model for the external device; and (c) constructing a timing test harness for a static timing analysis tool from the timing model for the external device and the design under timing analysis.

18 Claims, 10 Drawing Sheets

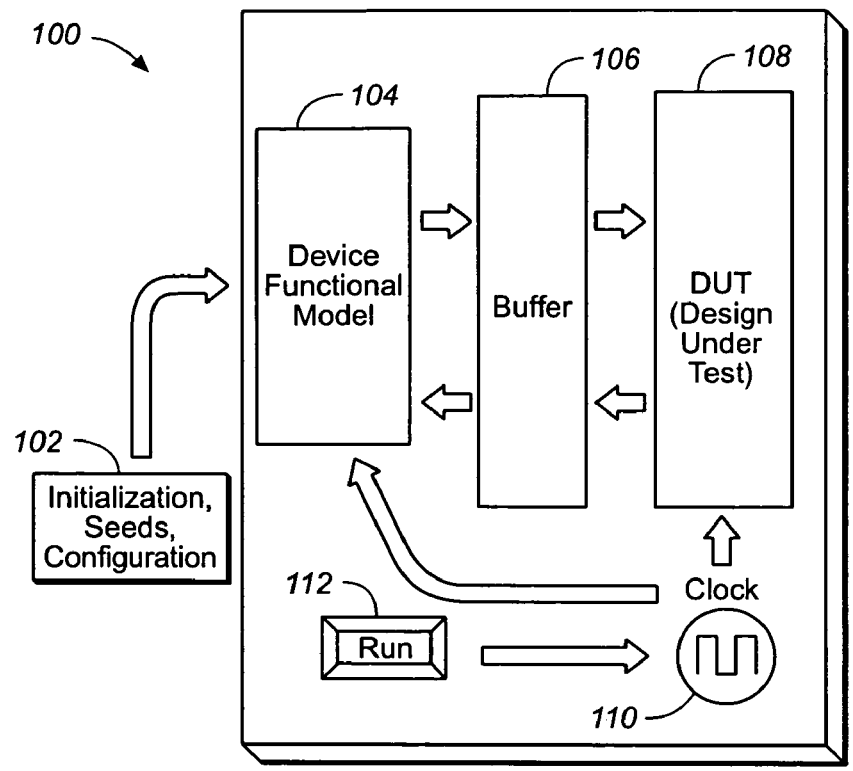
FIG._1 *(PRIOR ART)*
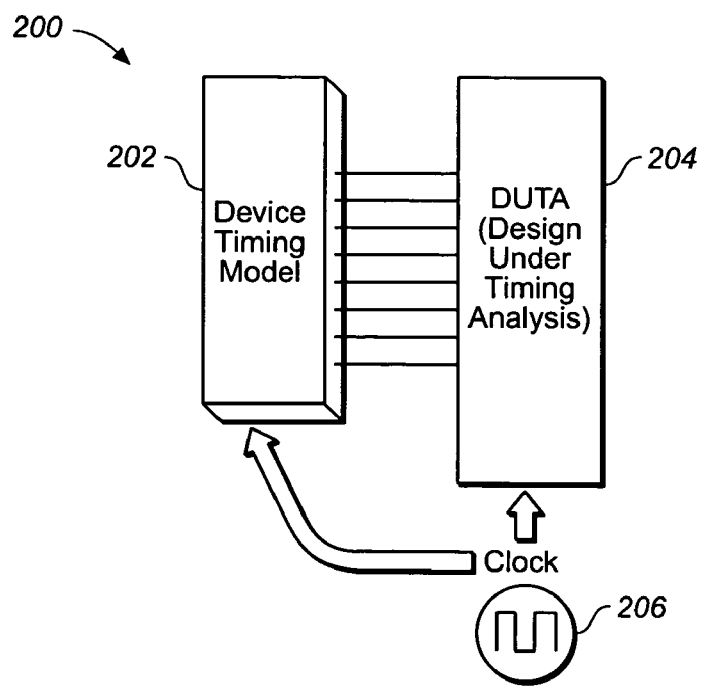
FIG._2

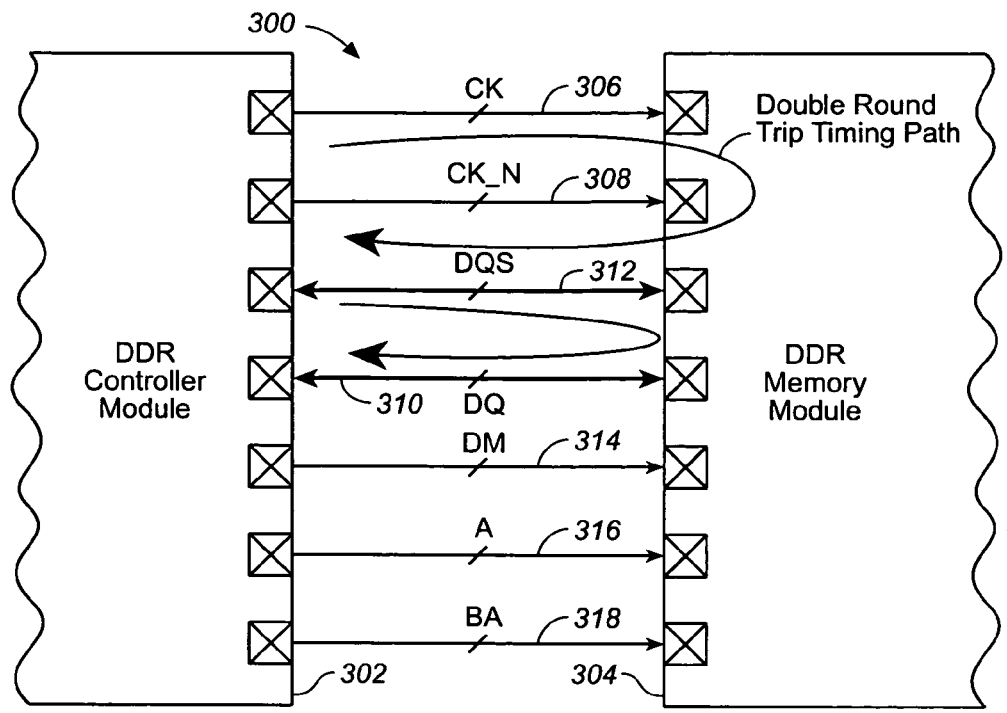
FIG._3 *(PRIOR ART)*
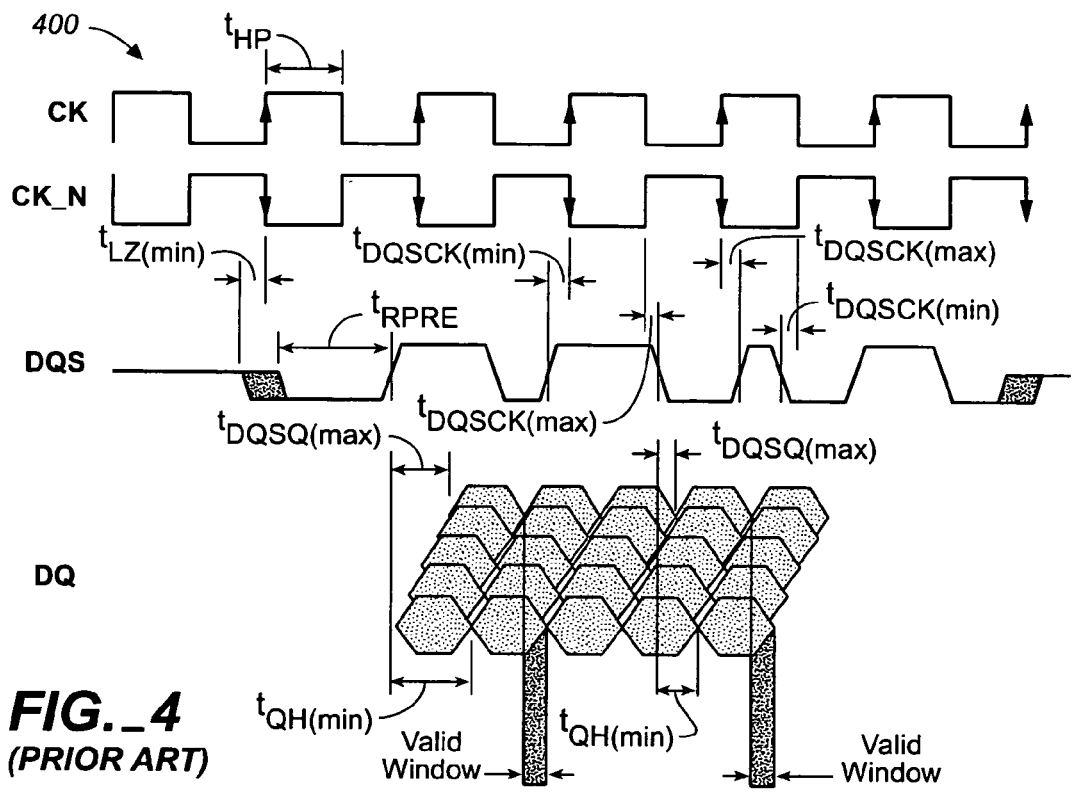
FIG._4 *(PRIOR ART)*

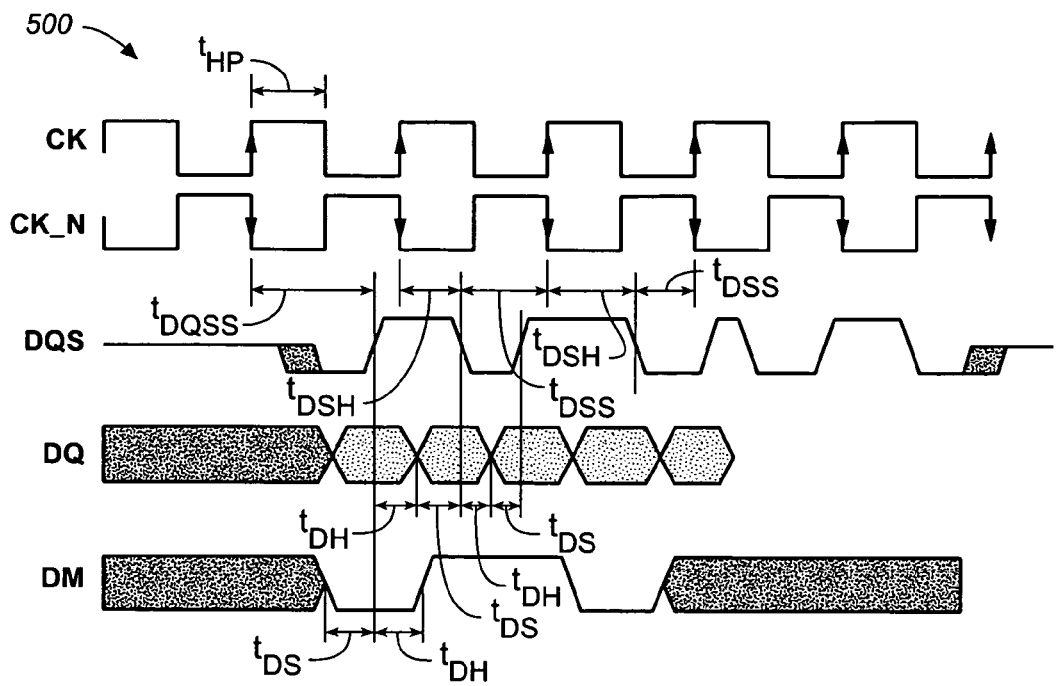
FIG._5 (PRIOR ART)
```
600
tIS :
    SETUP (POSEDGE) { A[0], A[1], A[2], A[3], A[4], A[5],
    A[6], A[7], A[8], A[9], A[10], BA[0], BA[1] } CK;
tIH :
    HOLD (POSEDGE) { A[0], A[1], A[2], A[3], A[4], A[5],
    A[6], A[7], A[8], A[9], A[10], BA[0], BA[1] } CK;
```
FIG._6
```
700
    ARCDATA
    tIH :
    RISE_CONSTRAINT (constraint_data) {
        VARIABLE_1 : CONSTRAINED_PIN_TRANSITION
            INDEX_1 ("0.0000, 1.0000");
            VALUES ("1.1000, 1.1000");
    }
    FALL_CONSTRAINT (constraint_data) {
        VARIABLE_1 : CONSTRAINED_PIN_TRANSITION
            INDEX_1 ("0.0000, 1.0000");
            VALUES ("1.1000, 1.1000");
    }
    ENDARCDATA
```
FIG._7

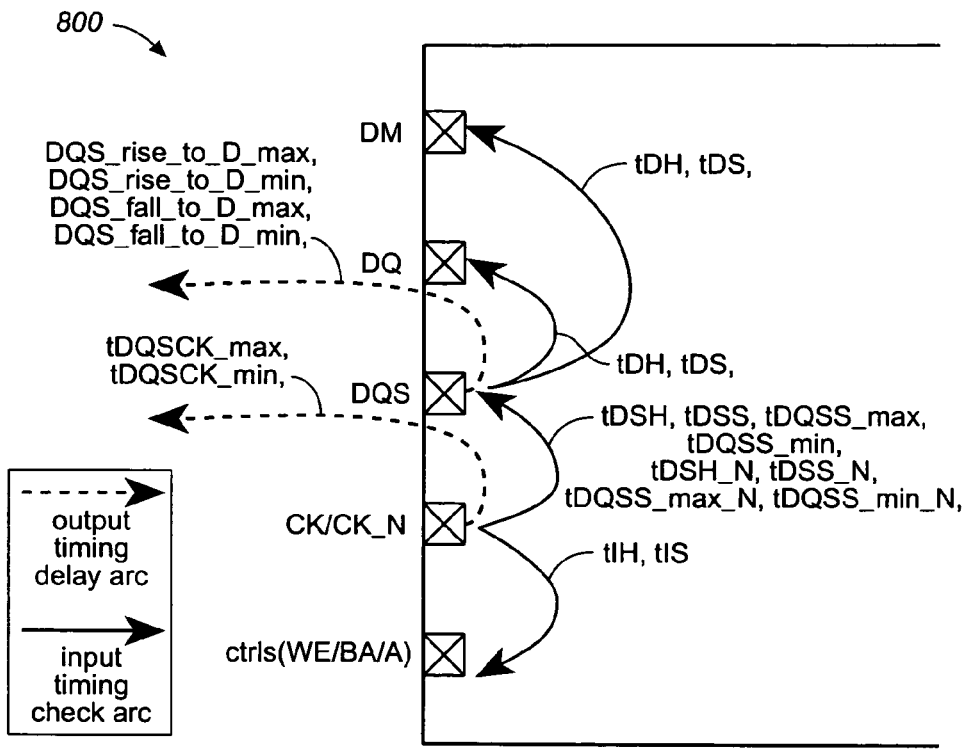
FIG._8
```
900
ARCDATA
tDSS :
FALL_CONSTRAINT (constraint_data) {
    VARIABLE_1 : CONSTRAINED_PIN_TRANSITION
    VARIABLE_2 : RELATED_PIN_TRANSITION
    INDEX_1 ("0.0000, 1.0000");
    INDEX_2 ("0.0000, 1.0000");
    VALUES ("1.6000, 1.6000",
            "1.6000, 1.6000");
}
ENDARCDATA
ARCDATA
tDSS_N :
RISE_CONSTRAINT (constraint_data) {
    VARIABLE_1 : CONSTRAINED_PIN_TRANSITION
    VARIABLE_2 : RELATED_PIN_TRANSITION
    INDEX_1 ("0.0000, 1.0000");
    INDEX_2 ("0.0000, 1.0000");
    VALUES ("1.6000, 1.6000",
            "1.6000, 1.6000");
}
ENDARCDATA
```
FIG._9

```
                ARCDATA
1000 ─┐         tDSS :
                FALL_CONSTRAINT (constraint_data) {
                    VARIABLE_1 : CONSTRAINED_PIN_TRANSITION
                    VARIABLE_2 : RELATED_PIN_TRANSITION
                    INDEX_1 ("0.0000, 1.0000");
                    INDEX_2 ("0.0000, 1.0000");
                    VALUES ("1.6000, 1.6000",
                            "1.6000, 1.6000");
                }
                ENDARCDATA
```

FIG._10

```
                ARCDATA
                tDQSS_max :
                RISE_CONSTRAINT (constraint_data) {
                    VARIABLE_1 : CONSTRAINED_PIN_TRANSITION
                    VARIABLE_2 : RELATED_PIN_TRANSITION
                    INDEX_1 ("0.0000, 1.0000");
                    INDEX_2 ("0.0000, 1.0000");
                    VALUES ("2.0000, 2.0000",
                            "2.0000, 2.0000");
                }
                ENDARCDATA
```

1100 ─┐

```
DQS_fall_to_D_max :
    DELAY (NEGEDGE) DQS_out { D_out[0], D_out[1], D_out[2],
    D_out[3], D_out[4], D_out[5], D_out[6], D_out[7], D_out[8],
    D_out[9], D_out[10], D_out[11], D_out[12], D_out[13],
    D_out[14], D_out[15], D_out[16], D_out[17], D_out[18],
    D_out[19], D_out[20], D_out[21], D_out[22], D_out[23],
    D_out[24], D_out[25], D_out[26], D_out[27], D_out[28],
    D_out[29], D_out[30], D_out[31] };

tDQSCK_max :
    DELAY (NONINVERTING) CK DQS_out;
```

FIG._11

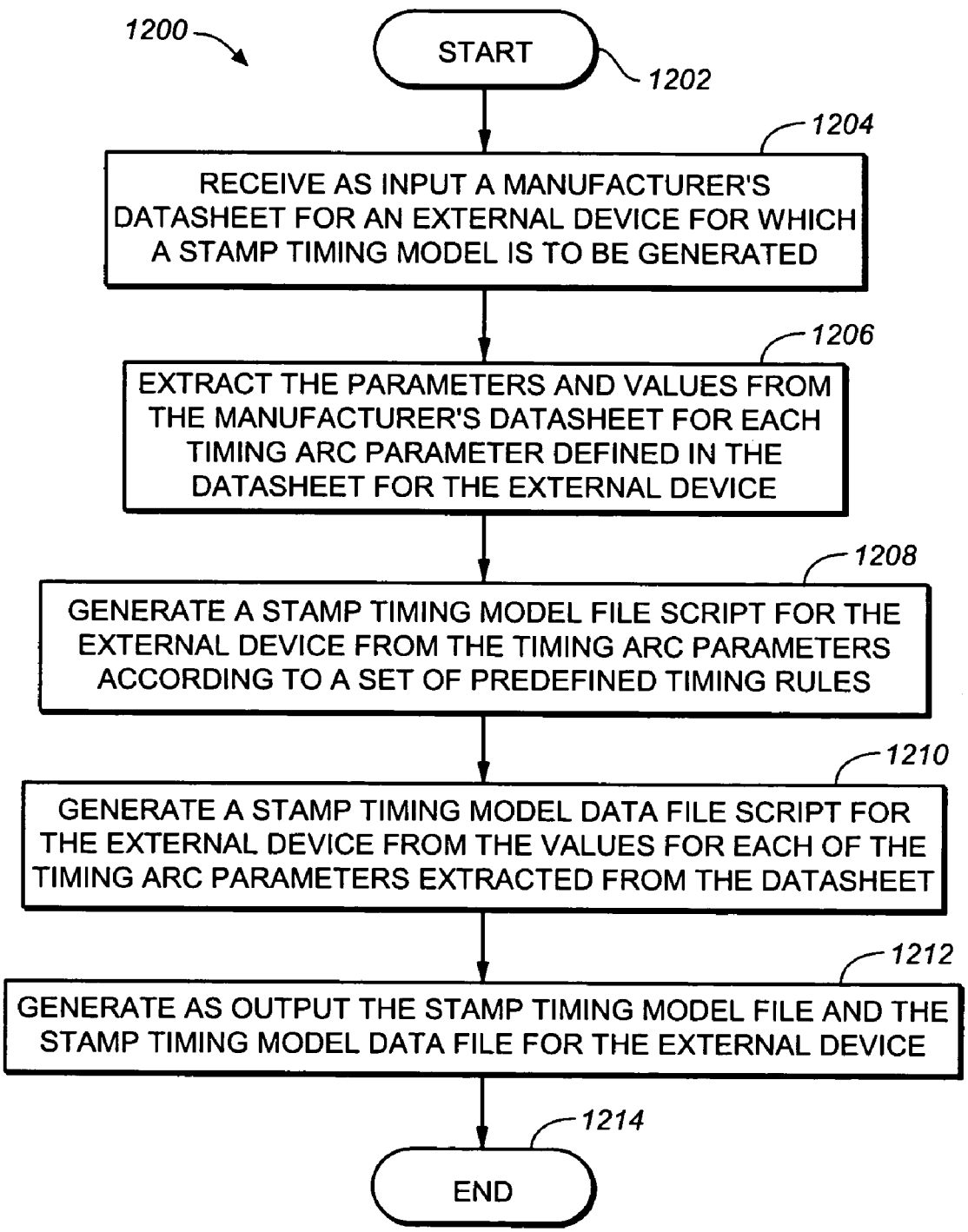
FIG._12

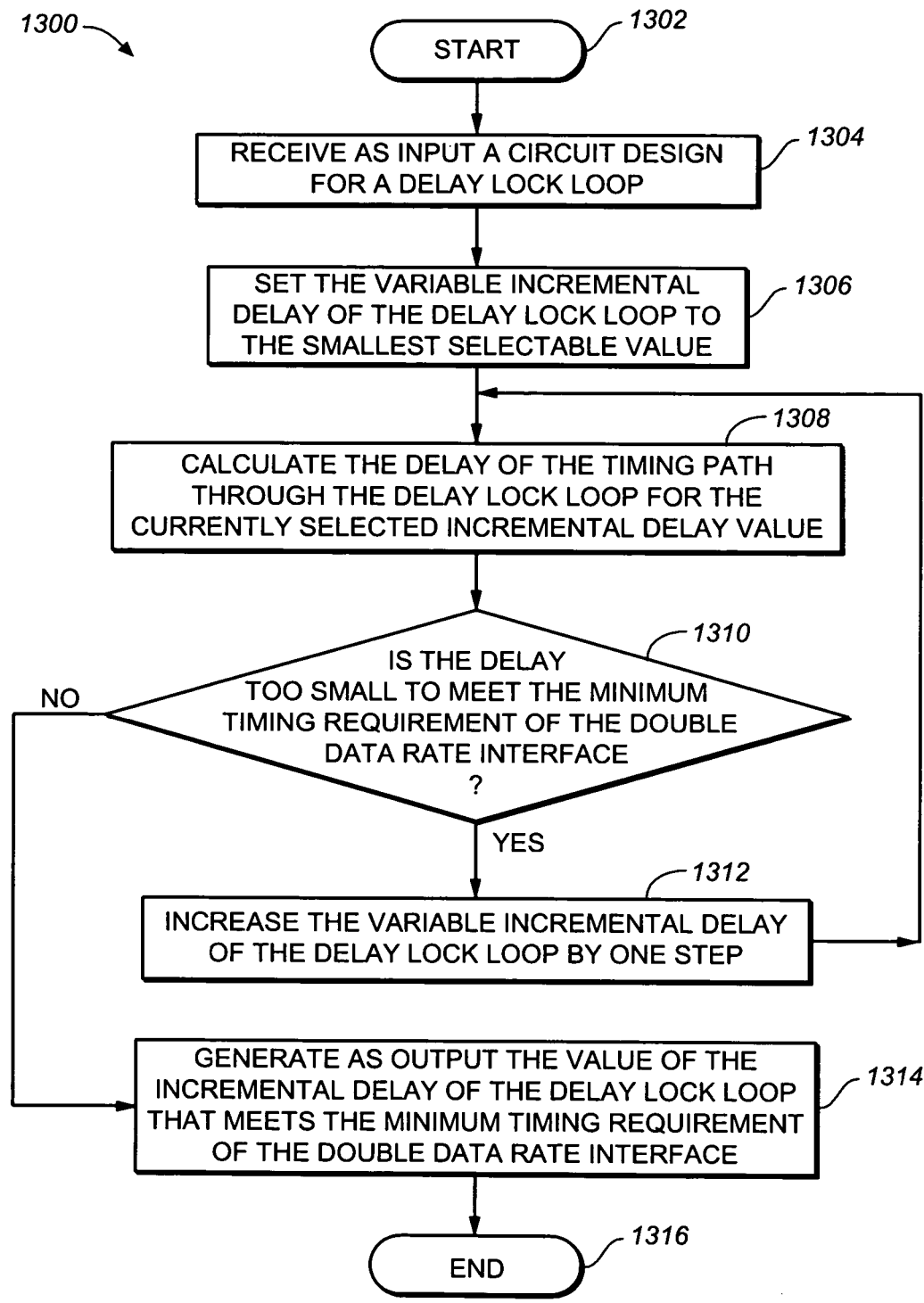
FIG._13

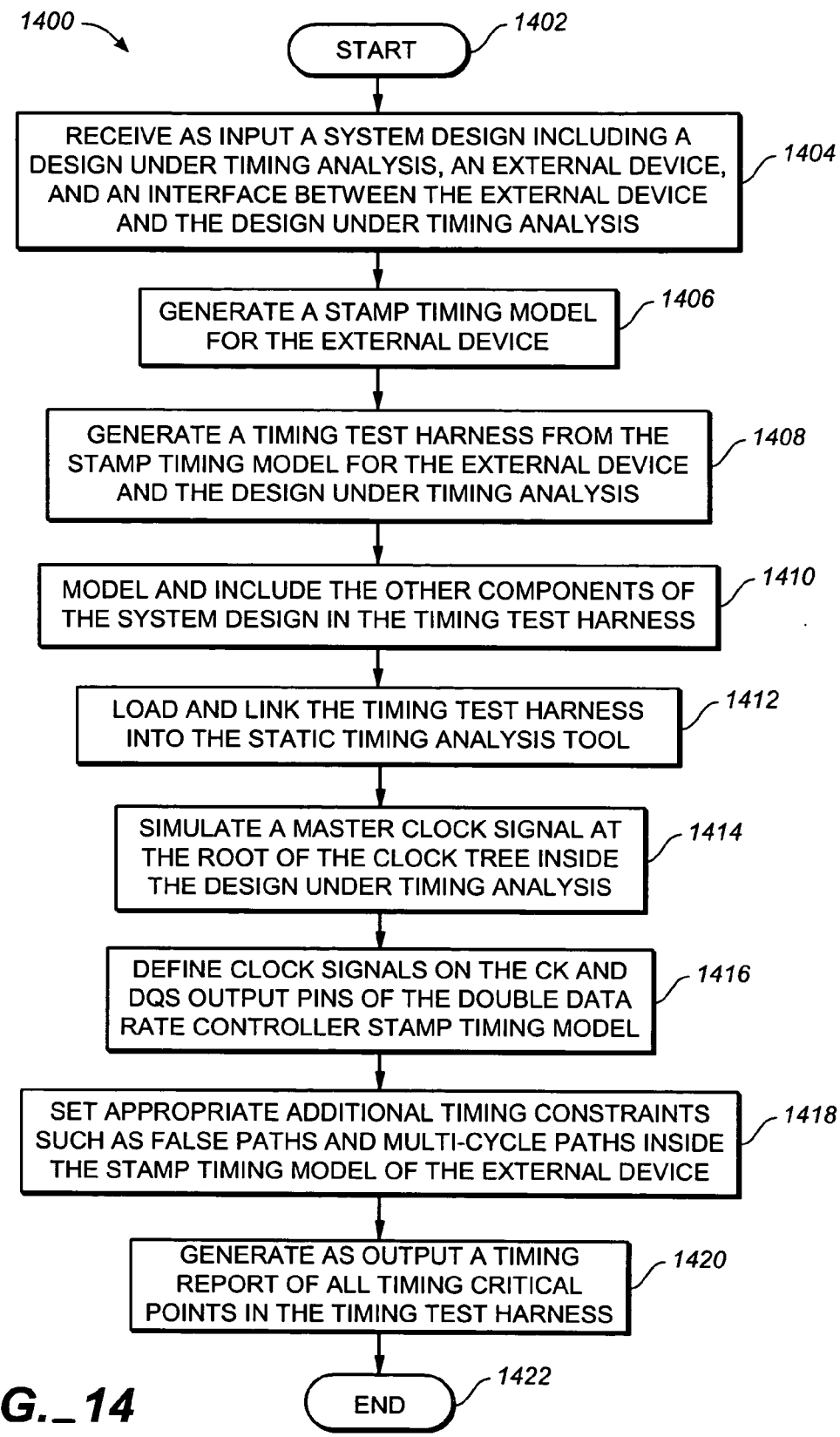
FIG._14

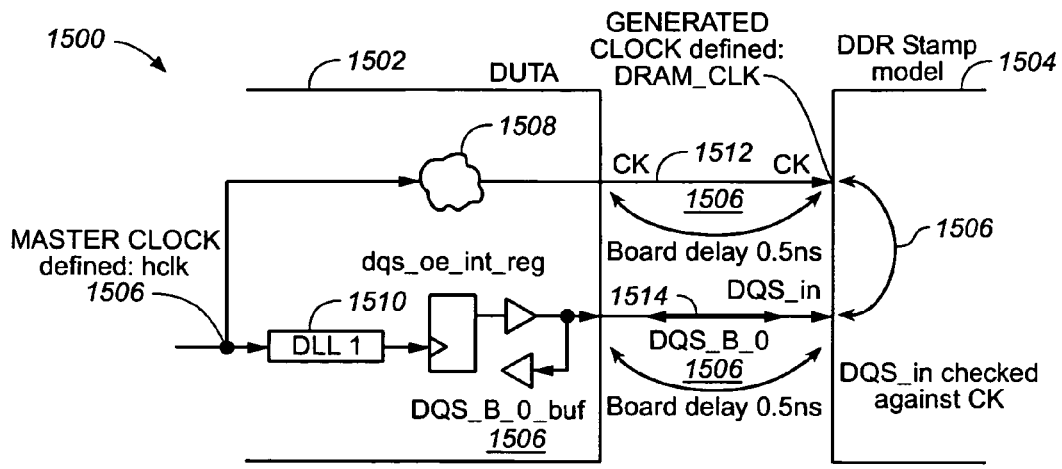
FIG._15
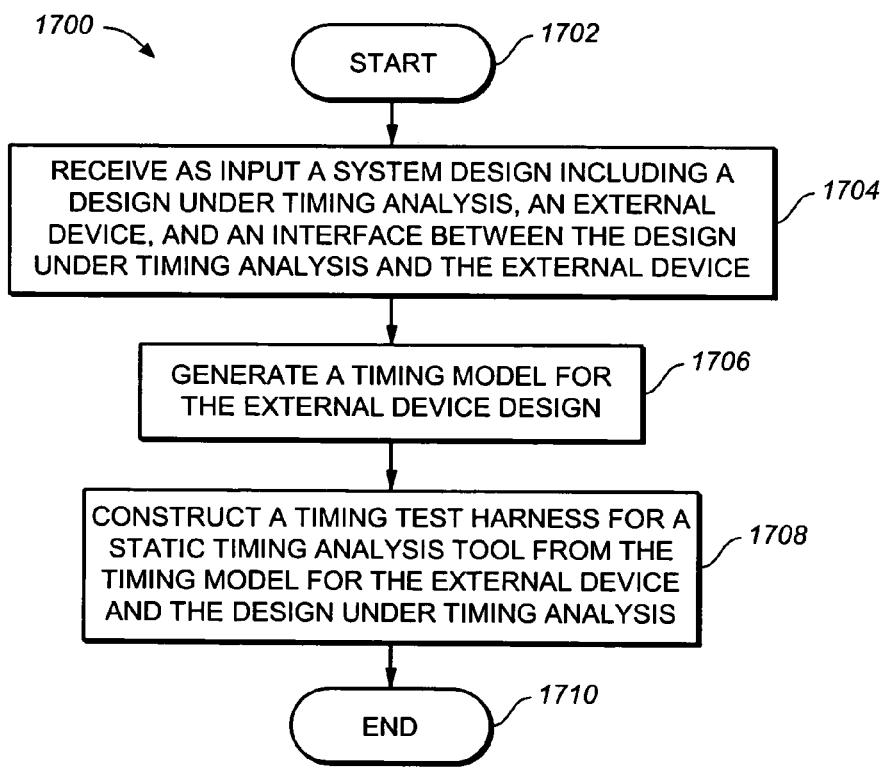
FIG._17

1600 ⟶

```
Startpoint:
chip_inst/chip_top_inst/ddr_control_inst/io/dqs_0/dqs_oe_int_reg
          (rising edge-triggered flip-flop clocked by hclk)
  Endpoint: DRAM (falling edge-triggered flip-flop clocked
            by DRAM_CLK)
  Path Group: DRAM_CLK
  Path Type: max Point                                              Incr       Path
  ---------------------------------------------------------------------
  clock hlck (rise edge)                             0.00       0.00
  clock network delay (propagated)                   6.48       6.48
  chip_inst/chip_top_inst/ddr_control_inst/io/dqs_0/
  dqs_oe_int_reg/CK
  (SMDFFHQX2)
                                                     0.00       6.48r
  chip_inst/chip_top_inst/ddr_control_inst/io/dqs_0/
  dqs_oe_int_reg/Q
  (SMDFFHQX2)
                                                     0.25       6.73r
  chip_inst/chip_top_inst/ddr_control_inst/io/dqs_0/dqs_oe
  (io_dqscell)
                                                     0.00       6.73r
  chip_inst/chip_top_inst/ddr_control_inst/io/dqs_oe [0]
  (io)
                                                     0.00       6.73r
  chip_inst/chip_top_inst/ddr_control_inst/dqs_oe [0]
  (ddr_control)
                                                     0.00       6.73r
  chip_inst/chip_top_inst/DDRDQS_E [0] (obelix_top)
                                                     0.00       6.73r
  chip_inst/DQS_B_0_buf/PAD (sstl)                   2.66       9.39r
  chip_inst/DQS_B_0 (chip) <-                        0.50*      9.89r
  DRAM/DQS_in (mt46v16M4)                            0.00*      9.89r
  data arrival time                                             9.89 clock DRAM_CLK (fall edge)                        12.00      12.00
  clock network delay (propagated)                  -0.64      11.36
  clock reconvergence pessimism                      0.00      11.36
  DRAM/CK (mt46v16M4)                                          11.36f
  library setup time                                -2.00       9.36
  data required time                                            9.36
  ---------------------------------------------------------------------
  data required time                                            9.36
  data arrival time                                            -9.89
  ---------------------------------------------------------------------
  slack (VIOLATED)                                             -0.53
```

FIG._16

METHOD AND TIMING HARNESS FOR SYSTEM LEVEL STATIC TIMING ANALYSIS

BACKGROUND OF THE INVENTION

1. Field of the Invention

The method of system level static timing analysis disclosed herein is directed to the design and manufacturing of integrated circuit die. More specifically, but without limitation thereto, this method is directed to detecting timing violations in the design of an integrated circuit die.

2. Description of Related Art

System level static timing analysis is widely used in different aspects of physical design validation of an integrated circuit design. Traditionally, input and output (I/O) timing closure, for example, of a very large scale integrated circuit (VLSI) device is based on defining boundary constraints. This involves defining input delay, output delay, and the corresponding load on an output port. The input delay is set to constrain a setup/hold timing requirement on an input data port with respect to an input clock signal. The output delay defines an output delay constraint on an output data port with respect to an output clock signal. There are several ways to define clock signals in static timing analysis (STA), for example, a generated clock, a virtual clock, and so on. A generated clock is produced by a master clock by a clock divider or a gating circuit. The phase of a generated clock is maintained in a timing analysis perspective. A virtual clock has no real source in the integrated circuit design itself, that is, a virtual clock does not drive any clock pins. A virtual clock is used primarily as a reference clock edge for defining input/output requirements. These definitions of clock signals have been adequate for analyzing most I/O timing requirements.

SUMMARY OF THE INVENTION

In exemplary embodiments, a method and computer program product include steps of:

(a) receiving as input a system design including a design under timing analysis and an associated external device design;

(b) generating a timing model for the external device design; and (c) constructing a timing test harness from the timing model and the design under timing analysis.

In another embodiment, a timing test harness includes:

a timing model of an external device;

a timing model of a design under timing analysis; and a timing model of an interface between the external device and the design under timing analysis.

BRIEF DESCRIPTION OF THE DRAWINGS

The embodiments described herein are illustrated by way of example and not limitation in the accompanying figures, in which like references indicate similar elements throughout the several views of the drawings, and in which:

FIG. 1 illustrates a functional diagram of a typical test harness for functional verification used in the prior art;

FIG. 2 illustrates a functional diagram of a timing test harness for system static timing analysis;

FIG. 3 illustrates an example of a typical double data rate synchronous dynamic random access memory interface of the prior art;

FIG. 4 illustrates a timing diagram of the data output timing requirements for a read cycle relative to a DDR SDRAM across the interface of FIG. 3;

FIG. 5 illustrates a timing diagram of the data output timing requirements for a write cycle relative to DDR SDRAM across the interface of FIG. 3;

FIG. 6 illustrates a script for a timing model for the timing arcs of Table 1;

FIG. 7 illustrates a script for timing model data for the timing arcs of Table 1;

FIG. 8 illustrates the timing arcs of a typical DDR SDRAM STAMP timing model;

FIG. 9 illustrates a script of a model data file for the timing model of FIG. 8;

FIG. 10 illustrates a script for timing model data for the timing model of Table 5;

FIG. 11 illustrates a script for a timing model of the data strobe DQS for the timing test harness of FIG. 2;

FIG. 12 illustrates a flow chart for a method of automating a STAMP timing model from a manufacturer's datasheet for the timing test harness of FIG. 2;

FIG. 13 illustrates a flow chart for a method of simulating a delay locked line for the timing test harness of FIG. 2;

FIG. 14 illustrates a flow chart for a method of system static timing analysis with the timing test harness of FIG. 2;

FIG. 15 illustrates a specific example of timing critical points in the timing test harness of FIG. 2 that are reported by the system static timing analysis;

FIG. 16 illustrates an example of a timing report generated by a system static timing analysis for the timing test harness of FIG. 15; and FIG. 17 illustrates a flow chart for a method of system static timing analysis.

Elements in the figures are illustrated for simplicity and clarity and have not necessarily been drawn to scale. For example, the dimensions of some elements in the figures may be exaggerated relative to other elements to point out distinctive features in the illustrated embodiments.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

DESCRIPTION OF THE ILLUSTRATED EMBODIMENTS

Static timing analysis of high-speed devices is a challenging task. For example, a double data rate (DDR) synchronous dynamic random access memory (SDRAM) interface having complex timing requirements in a system on chip integrated circuit design typically involves scripting different clock phases and multiple static timing analysis cycles with different clock definitions. For a double data rate device, since both the rising and falling edges of the clock are used, both a clock and a 180-degree phase shifted clock are involved. On the other hand, the implementation of a double data rate controller design involves delaying the clock by delay chains, and a delayed clock implies a phase shift in the clock edge.

Double data rate devices usually require an additional signal to synchronize the data on top of the clock. The additional signal behaves as both clock and data and is usually bi-directional. As a result, multiple conflicting definitions of generated clocks occur using previous methods of input/output timing analysis, and multiple runs are necessary to separate the definitions so that conflicts do not occur.

In a typical example of a DDR SDRAM interface, one of the signals, called DQS, is a boundary port having a dual nature. First, DQS is a timing constrained signal referenced to the main clock CK. Second, DQS is a clock signal that is referenced by the data signal DQ. Also, DQS is a bi-directional signal, which further complicates the timing analysis.

The embodiments described below expand the capability of static timing analysis by extending the system level verification concept from functional design validation to static timing analysis. By building the necessary timing models and instantiating the models in a test harness, the system static timing analysis is enhanced with flexibility, scalability, and visibility.

A system on chip (SoC) device ultimately interfaces with several peripheral devices. System level verification has become a standard in functional validation, and the system level simulation environment is provided by a test harness. The test harness includes the design under test (DUT) and all other peripheral devices that are present in the system.

FIG. 1 illustrates a functional diagram 100 of a typical test harness for functional verification used in the prior art. Shown in FIG. 1 are inputs 102, an external device functional model 104, a buffer 106, a design under test 108, a clock generator 110, and a run/start signal 112.

The inputs 102 of the test harness 100 are initialization, seeds, and configuration. Before the start of simulation, that is, the functional verification process, the devices in the test harness 100 including the design under test (DUT) may require initialization and proper configuration. Some verification environments provide the flexibility to randomize the running states, for example, when to activate the data, or the input data itself. A seed is used to initialize the random number generator.

The external device functional model 104 models the functions of the devices that are used in conjunction with the design under test at the system level.

The buffer 106 interfaces the external device functional model 104 and the design under test 108 and functions as a hook for monitoring the signals communicated between them.

The design under test 108 models the design to be tested, for example, a double data rate synchronous dynamic random access memory (DDR SDRAM).

The clock generator 110 serves as the external clock source, if required. When the clock generator 110 is running, the operation of the design under test 108 and the external device functional model 104 is activated, and the simulation begins.

The run/start signal 112 serves as a switch to activate the clock generator 110.

An advantage of analyzing a device at the system level is that its overall functional performance may be simulated completely. The operating environment of the external device 104 is included in the model, and different operating states may be considered in the system level verification by using different configuration settings for the design under test 108 and the external device functional model 104. For example, an ethernet interface may have different modes of operation including GMII, SMII, and MII. The object-oriented nature of the system level design is also well suited to the application of a high level computer programming language such as C, C++, and System C. System level verification has proven to be a useful tool for functional verification of complex system on chip designs.

In one embodiment, a method of system level static timing analysis includes steps of:

(a) receiving as input a system design including a design under timing analysis, an external device, and an interface between the design under timing analysis and the external device;

(b) generating a timing model for the external device design; and (c) constructing a timing test harness for a static timing analysis tool from the timing model for the external device and the design under timing analysis.

An analogous approach to the system level functional verification concept of FIG. 1 may be applied to create an improved method of system static timing analysis as follows.

FIG. 2 illustrates a functional diagram of a timing test harness 200 for system static timing analysis. Shown in FIG. 2 are an external device timing model 202, a timing model for a design under timing analysis (DUTA) 204, and a clock generator 206.

The external device timing model 202 is a physical description of the timing requirements of the external device so that complex timing constraints may be modeled properly and in complete detail. For example, the external device timing model 202 may be implemented as a script in a model file according to well known computer programming techniques that specifies the relationships of the timing parameters of an external device and a model data file that specifies the values of the parameters for a specific manufacturing process. In this arrangement, separate device timing models may be constructed to reflect the timing requirements of multiple vendors so that the appropriate device timing model 202 may be readily inserted into the timing test harness 200 to report timing results for the selected vendor. It is possible to use multiple external device timing models in the same timing test harness. The timing test harness 200 may be scaled to systems in which more than one device is driven by the same system bus by constructing a corresponding timing test harness 200 for each device. Further, by expanding the level of analysis from the chip level to the system level, timing reports may be generated that display timing paths at the system level in step-by-step detail. The increased visibility of the system level timing provided by the timing test harness 200 reduces the difficulty of tracing and correcting timing violations compared to previous methods of I/O boundary analysis.

The following example illustrates the construction of a timing test harness for a double data rate (DDR) synchronous dynamic random access memory (SDRAM) interface, however, the same method may also be applied advantageously to construct timing test harnesses for other devices having complex timing requirements.

Before DDR SDRAM, timing closure for single data rate SDRAM was already a difficult problem. DDR SDRAM doubles the speed of SDRAM and uses a source synchronous scheme, that is, both the rising and the falling edges of a clock are used for synchronization. DDR SDRAM also has a complementary clock CK_N in addition to the non-inverted clock signal CK. To synchronize the data properly, a new signal DQS is added to the double data rate scheme. In a write cycle, the DDR controller drives the DQS signal and the data bit lines DQ. In a read cycle, the DDR SDRAM drives the DQS signal and the data bit lines DQ. The other signals in the DDR SDRAM interface are standard SDRAM signals.

FIG. 3 illustrates an example of a typical double data rate synchronous dynamic random access memory interface 300 of the prior art. Shown in FIG. 3 are a DDR controller module 302, a DDR SDRAM module 304, complementary clock signals CK 306 and CK_N 308, a bi-directional data bus DQ 310, a bi-directional data strobe DQS 312, a data mask DM 314, an address bus A 316, and a bank address BA 318.

All of the DDR controller signals are sampled on the rising edge of CK 306 and the falling edge of CK_N 308. The data strobe DQS 312 is used to capture data and is transmitted and received with the data bus DQ 310. In a read cycle, the data strobe DQS 312 is aligned with the edge of the read data on the data bus DQ 310, while in a write cycle, the data strobe DQS 312 is aligned with the center of the write data on the data bus DQ 310, and the write data is masked, that is, inhbited, when the data mask DM 314 is sampled in the high state. The address bus A 316 provides the row and column addresses for both read and write commands, and the bank address BA 318 defines which memory bank is being addressed by both read and write commands.

Three aspects of system level static timing analysis for the example of the DDR SRAM interface are (1) the dual nature of the data strobe DQS 312, (2) the dual edge timing constraints with reference to the complementary clock signals CK 306 and CK_N 308 and likewise for the data bus DQ 310 with reference to the data strobe DQS 312, and (3) the round trip timing of the data strobe DQS 312. The timing of the data strobe DQS 312, the dual edge timing constraints, and the round trip timing of the data strobe DQS 312 are illustrated in the timing diagrams of FIGS. 4 and 5.

FIG. 4 illustrates a timing diagram 400 of the data output timing requirements for a read cycle relative to a DDR SDRAM across the interface of FIG. 3. The timing constraints of the data strobe DQS 312 with reference to the complementary clock signals CK 306 and CK_N 308 are shown as $t_{DQSCK(min)}$ and $t_{DQSCK(max)}$.

FIG. 5 illustrates a timing diagram 500 of the data output timing requirements for a write cycle relative to a DDR SDRAM across the interface of FIG. 3. The timing constraints of the data bus DQ 310 with reference to the data strobe DQS 312 are shown as $t_{DH}$ and $t_{DS}$. On the other hand, there are different timing constraints for the data strobe DQS 312 for the rising data edge and the falling data edge of the data bus DQ 310, shown as $t_{DQSS}$, $t_{DSS}$, and $t_{DSH}$.

Two round trip timing paths of the data strobe DQS 312 are shown in the DDR SDRAM interface 300 of FIG. 3. The DDR SDRAM interface 300 is a high-speed interface, consequently the DDR controller module 302 has to capture the data bus DQ 310 in the clock domain of the data strobe DQS 312 before the captured data is re-synchronized in the main clock domain internal to the DDR controller module 302. The complementary clock signals CK 306 and CK_N 308 are generated in the main clock domain.

During input timing analysis with reference to the DDR controller module 302, the data strobe DQS 312 has to traverse some delay before clocking the flip-flops in the DDR controller module 302 that latch the data bus DQ 310 from the DDR SDRAM module 304. At the same time, the skew between the clock domain of the data strobe DQS 312 and the main clock domain of the complementary clock signals CK 306 and CK_N 308 in the re-synchronization logic is also timing critical. Accordingly, the round trip path involves two groups of timing paths, one for each clock domain. One timing path group starts from the data bus DQ 310 round trip path to the capturing flip-flops that are clocked by the data strobe DQS 312 round trip path. The other timing path group ends at the re-synchronization registers that are clocked in the main clock domain of the DDR controller module 302. The start point clock is also the data strobe DQS 312 round trip path.

The round trip path is the path that starts from a device, crosses over an interface to another device, then loops back to the first device. In this case, the data strobe DQS 312 timing path starts from the main clock domain, typically through the delay locked loop in the DDR controller module 302, from the complementary clock signals CK 306 and CK_N 308 to the DDR SDRAM module 304, as the output data strobe DQS 312 from the DDR SDRAM module 304, and back to drive capture flip-flops in the DDR controller module 302.

Defining constraints that model the timing relationships described above completely is clearly not a trivial task. The dual nature of the data strobe DQS 312 may be accommodated by performing the static timing analysis twice, once to check the timing of the data strobe DQS 312 against the complementary clock signals CK 306 and CK_N 308 and again to check the timing of the data bus DQ 310 against the data strobe DQS 312. A disadvantage of this approach is that multiple static timing analysis runs are required, which substantially increases the time and cost of the circuit design.

The dual edge timing constraints may be modeled, for example, by a virtual clock approach as described in "Working with DDRs in PrimeTime", A. Cheng, SNUG San Jose 2002, however, this approach requires complicating scripting of the static timing analysis tool code.

A simple round trip timing path in a single data rate SDRAM may be modeled by a "generated clock" approach. The double data rate controller 302 includes round trip paths that are checked against each other. A previous approach involves manual calculation or estimation of the time that the feedback data arrives from the DDR SDRAM. However, this approach is prone to error and is also time consuming.

An "internal path" approach was proposed in "Static Timing Verification of Complex SoC design—Part I, DDR SDRAM Check in PrimeTime Revisit", F. Hui, SNUG Singapore 2002, however, not all the timing arcs required to completely define the required timing constraints are modeled in this method.

The timing model for the external device 202 in the timing test harness of FIG. 2 may be conveniently implemented according to well known computer programming techniques, for example, by the STAMP model protocol from Synopsys described in "PrimeTime Modeling User Guide", Ch. 6, App A-D. Each STAMP timing model includes two files, a model file and a model data file. The model file defines the port names of the external device, the timing arcs, and the timing checks, such as setup time, hold time, delay arc, and timing arcs that are referenced to the falling clock edge instead of the rising clock edge. The model data file defines the value of each of the timing arcs. Each model file may be associated with multiple model data files, however, in the example of a DDR SDRAM, there is generally only one model data file corresponding to the model file.

The timing arcs in the model file may be defined for each pair of signals having a timing relationship. For example, the timing arcs for the address and control input hold time and setup time for a typical DDR SDRAM are shown in Table 1 below:

TABLE 1

| Parameter | Symbol | MIN | MAX |
|---|---|---|---|
| address and control input hold time | tIH | 1.1 ns | 1.1 ns |
| address and control input setup time | tIS | 1.1 ns | 1.1 ns |

In the model file, the timing arcs may be written as illustrated in FIG. 6.

FIG. 6 illustrates a script 600 of a model file for the timing arcs of Table 1. The script 600 defines a setup and hold timing arc on ports A[0:10] and BA[0:1], respectively. The reference clock is the port CK. "POSEDGE" means that the timing check is performed against the rising edge of the clock signal.

In the model data file, a linear table is defined with a constant delay to lock the timing constraints to a selected value.

FIG. 7 illustrates a script 700 of a model data file for the model file of FIG. 6. A lookup table format is used to define a delay or a check value in the STAMP timing model data file. To fix the delay to a single value, a one-dimensional lookup table may be used as shown in Table 2 below:

TABLE 2

INDEX_1 ("0.0000, 1.0000");
VALUES ("1.1000, 1.1000");

In the example of Table 2, the lookup table has the key points (0.0,1.1) and (1.0,1.1) where 0.0 and 1.0 are the pin transition values and 1.1 is the delay value. As a result, the delay value is forced to a flat value of 1.1 ns. The values of all the timing requirements may generally be found in the AC operating conditions of a DDR SDRAM data sheet.

FIG. 8 illustrates the timing arcs of a typical DDR SDRAM STAMP timing model 800. In this example, $t_{DQSCK}$ is separated into two timing arcs, $t_{DQSCK\_min}$ and $t_{DQSCK\_max}$ because both minimum and maximum values are specified in the manufacturer's DDR SDRAM datasheet, and a single timing arc cannot completely model both values. The same applies to the timing parameter $t_{DQSS}$.

Likewise, the output delay timing arc from the data strobe DQS to the data bus DQ involves both rising and falling edges as shown in FIGS. 4 and 5. Accordingly, the parameters $T_{DQSQ}$ and $t_{QH}$ in the datasheet are translated into four timing arcs as shown in Table 3 below:

TABLE 3

DQS_rise_to_D_max - maximum delay from rising DQS to DQ
DQS_rise_to_D_min - minimum delay from rising DQS to DQ
DQS_fall_to_D_max - maximum delay from falling DQS to DQ
DQS_fall_to_D_min - minimum delay from falling DQS to DQ The input timing for the data strobe DQS in FIG. 5 shows the two-edged timing constraint. The data strobe DQS has a different timing requirement on its rising and falling edges when it references the main clock CK for $t_{DSS}$ and $t_{DQSS}$. Also, both edges of the data strobe DQS have similar timing requirements with reference to the main clock CK_N. The modeling of the data strobe DQS may be achieved by defining a similar arc twice, one for the main clock CK and one for the complementary main clock CK_N as shown in Table 4 below:

TABLE 4

$t_{DSS}$ :
    SETUP (POSEDGE) DQS_in CK;
$t_{DSS\_N}$ :
    SETUP (POSEDGE) DQS_in CK_N;

In the model data file, the same value of $t_{DSS}$=1.6 ns is used for both $t_{DSS}$ and $t_{DSS\_N}$ in the example of FIG. 9.

FIG. 9 illustrates a script 900 of a model data file for the timing model of FIG. 8. The same lookup table format used in FIG. 7 is used, except in this case the lookup table is two-dimensional with four values each for $t_{DSS}$ and $t_{DSS\_N}$.

In the STAMP timing model file, rising and falling edges may only be specified for the reference clock, however, this is not sufficient to model $t_{DSS}$ and $t_{DSS\_N}$. Fortunately, rise and fall constraints may be declared separately in the model data file. In the following example, $t_{DSS}$ and $t_{DSS\_max}$ are defined as usual in the model file script shown in Table 5 below:

TABLE 5

$t_{DSS}$ :
    SETUP (POSEDGE) DQS_in CK;
$t_{DSS\_max}$ :
    SETUP (NEGEDGE) DQS_in CK;

Instead of defining both a "FALL_CONSTRAINT" and a "RISE_CONSTRAINT" in the STAMP timing model data file, only the fall constraint for $t_{DSS}$ is defined. As a result, the rise and fall constraints on the data strobe DQS will have different timing arcs to meet the requirements for $t_{DSS}$ and $t_{DSS\_max}$ respectively.

FIG. 10 illustrates a script 1000 for timing model data for the timing model of Table 5. The same lookup table format used in FIG. 7 is used, except in this case the lookup table is two-dimensional with four values each for $t_{DSS}$ and $t_{DSS\_max}$.

The dual nature of the data strobe DQS in the DDR SDRAM interface may be modeled in the STAMP timing model file by defining the data strobe DQS both as a reference port to the data bus DQ and as a constrained port with reference to the main clock CK and CK_N as shown in FIG. 11.

FIG. 11 illustrates a script 1100 for a timing model of the data strobe DQS for the timing test harness of FIG. 2. In FIG. 11, two groups of DQS timing arcs are shown. The data strobe DQS is a data signal referenced to the main clock CK in $t_{DQSCK\_MAX}$, while the data strobe DQS is a clock signal referenced by the data bus DQ in DQS_fall_to_D_max.

Manufacturers' datasheets for DDR SDRAMs usually have a standardized timing requirement, and the notation and definitions of such parameters as $t_{DSS}$, $t_{DSH}$, and so on are generally accepted. Accordingly, the STAMP timing models for such devices may be automated as follows.

FIG. 12 illustrates a flow chart 1200 for a method of automating a STAMP timing model from a manufacturer's datasheet for the timing test harness of FIG. 2.

Step 1202 is the entry point of the flow chart 1200.

In step 1204, a manufacturer's datasheet for an external device for which a STAMP timing model is to be generated is received as input, for example, in a computer readable format such as a PDF file.

In step 1206, a parser extracts the parameters and values from the manufacturer's datasheet for each timing arc parameter defined in the datasheet for the external device.

In step 1208, a STAMP script constituting the external device timing model is generated from the timing arc parameters according to a set of predefined timing rules, for example, as described above for the example of the DDR SDRAM. For a set of devices manufactured by the same vendor, the format of the datasheets is likely to be similar. As a result, the generation of the models for each of the devices in the set may be fully automated using the same script. In the case of datasheets having different formats, for example, from different vendors, a modification of the parser script may be used to extract the timing parameters for each datasheet format.

In step 1210, a STAMP timing model data file script constituting the external device timing model is generated from the values for each of the timing arc parameters extracted from the datasheet.

In step 1212, the STAMP timing model file and the STAMP timing model data file constituting the external device timing model are generated as output.

Step 1214 is the exit point of the flow chart 1200.

By inserting different external device timing models to construct the system static timing analysis timing test harness of FIG. 2, a circuit design may advantageously be checked with several memory models of devices from different vendors to increase the coverage of the timing analysis.

In addition to the external device represented in this example by the DDR SDRAM, there are other components of the timing test harness to be modeled, for example, a phase lock loop (PLL) and a delay lock loop (DLL) are typical components in a double data rate interface.

Modeling a phase lock loop in a static timing analysis tool such as PrimeTime is described, for example, in "Accounting for PLL Correction in Static Timing Analysis", Doc. ID 0000096, PrimeTime, Solvnet, Synopsys Inc. On the other hand, the simple delay cancellation approach used in phase lock loop modeling may not be properly applied to a delay lock loop.

A delay lock loop is a circuit that has a variable delay that may be locked to a selected value in incrementally discrete steps. A TCL script may be used in PrimeTime to model a delay lock loop as follows.

FIG. 13 illustrates a flow chart 1300 for a method of simulating a delay lock loop for the timing test harness of FIG. 2.

Step 1302 is the entry point of the flow chart 1300.

In step 1304, a circuit design for a delay lock loop is received as input. The circuit design may be, for example, the register transfer level code or the gate level netlist for a delay lock loop.

In step 1306, the variable incremental delay of the delay lock loop is set to the smallest selectable value.

In step 1308, the delay of the timing path through the delay lock loop is calculated for the currently selected incremental delay value.

In step 1310, if the delay is too small to meet the minimum timing requirement of the RTL code or the gate level netlist, then the method continues from step 1312. Otherwise, the method continues from step 1314.

In step 1312, the variable incremental delay of the delay lock loop is increased by one step, and the method continues from step 1308.

In step 1314, the value of the incremental delay of the delay lock loop that meets the minimum timing requirement of the double data rate interface is generated as output.

Step 1316 is the exit point of the flow chart 1300.

To model the board wire delay, suitable values of delay may be selected for the wire connections in the timing test harness, for example, by the following PrimeTime script in Table 6 below:

TABLE 6 set_annotated_delay -net -from DRAM/A[0] -to chip_inst/A[0] 0.5

Additional generic board wire load models may be developed according to well known techniques to improve the accuracy of the system static timing analysis.

To run the system static timing analysis, the timing test harness may be loaded and linked to the static timing analysis tools, for example, by the following PrimeTime script in Table 7 below:

TABLE 7 read_verilog TTH.v
read_verilog top_module.v
link TTH

In Table 7, TTH.v is a file containing the Verilog script for the timing test harness, and top_module.v is a file containing the Verilog script for the chip level netlist of the design under timing analysis (DUTA).

FIG. 14 illustrates a flow chart 1400 for a method of system static timing analysis with the timing test harness of FIG. 2.

Step 1402 is the entry point of the flow chart 1400.

In step 1404, a system design including a design under timing analysis, an external device, and an interface between the external device and the design under timing analysis are received as input.

In step 1406, the external device timing model is generated as described above with reference to FIG. 12.

In step 1408, a timing test harness is constructed from the external device timing model for the external device and the design under timing analysis.

In step 1410, the other components of the system design are modeled and included in the timing test harness, for example, the phase lock loop, the delay lock loop, and the board wire delay as described above with reference to FIG. 13 and Tables 6 and 7.

In step 1412, the timing test harness is loaded and linked into the static timing analysis tool.

In step 1414, after linking the timing test harness, a master clock signal is defined or simulated at the root of the clock tree inside the design under timing analysis. The master clock signal may be defined in static timing analysis tools by specifying where the clock signal is to be applied, the period of the clock signal, and the name of the clock signal.

In step 1416, clock signals are defined on the CK and DQS output pins of the double data rate controller STAMP timing model. These clock signals may also be defined in static timing analysis tools by specifying where the clock signal is to be applied, the period of the clock signal, and the name of the clock signal. The clock signals defined on the CK and DQS output pins are derived clock signals generated from the master clock signal.

In step 1418, depending on the design of the double data rate controller, appropriate additional timing constraints such as false paths and multi-cycle paths are set inside the STAMP timing model of the external device. A multi-cycle path is a path in which more than one clock cycle is allowed for data to propagate from the start point to the end point. For example, if a phase lock loop is used to synchronize the input clock to the DDR memory module, then the DQS input path to the DDR memory module is a two-cycle path. Constraints for "set_input_delay" or "set_output_delay" are usually not required for the DDR interface, because the timing requirement for the DDR memory module is generally fully described in the STAMP memory model.

In step 1420, a timing report of all timing critical points in the timing test harness is generated as output, for example, by a "report_timing" command. The timing report may be used for analysis and correction of timing violations.

Step 1422 is the exit point of the flow chart 1400.

FIG. 15 illustrates a specific example of timing critical points 1500 in the timing test harness of FIG. 2 that are reported by the system static timing analysis. Shown in FIG. 15 are a design under timing analysis module 1502, a DDR controller STAMP timing model 1504, timing critical points 1506, a logic cloud 1508, a delay locked loop 1510, a main clock CK pin 1512, and a data strobe DQS pin 1514.

Each of the timing critical points shown in FIG. 15 is associated with one of the components in the design under timing analysis module 1502 and the DDR controller STAMP timing model 1504. To model the board wire delay, a value of 0.5 ns appears next to the data strobe DQS pin 1514 input port and for the main clock CK pin 1512 path.

FIG. 16 illustrates an example of a timing report 1600 generated by a system static timing analysis for the timing test harness of FIG. 15. The timing report 1600 may be generated by the command "report_timing" to the endpoint "DRAM/DQS_in". The board wire delay does not appear in the timing report 1600 because it has already been embedded as part of the propagated clock network delay of DRAM_CLK.

The complex timing requirements of DDR SDRAM may be properly and completely modeled using STAMP timing models as described above, and the system static timing analysis method described above may be advantageously applied to assist in the analysis of virtually any complex SoC (system on chip) interface. Specifically, the dual nature of the data strobe DQS signal, the dual edge constraints of the data strobe DQS signal, and the data strobe DQS signal round trip paths may all be accommodated by the timing test harness of FIG. 2, in contrast to previous methods of static timing analysis.

FIG. 17 illustrates a flow chart for a method of system static timing analysis.

Step 1702 is the entry point of the flow chart 1700.

In step 1704, a system design is received as input including a design under timing analysis, an external device, and an interface between the design under timing analysis and the external device as described above with reference to FIG. 2.

In step 1706, a timing model is generated for the external device design as described above with reference to FIG. 12.

In step 1708, a timing test harness is constructed for a static timing analysis tool according to well known techniques from the timing model for the external device and the design under timing analysis.

Step 1710 is the exit point of the flow chart 1700.

The steps described above with regard to the flow chart described above may also be implemented by instructions performed on a computer. The instructions may be embodied in a medium such as a disk, CD-ROM, or other computer readable media according to well known computer programming techniques.

In another embodiment, a computer program product includes a medium for embodying a computer program for input to a computer and a computer program embodied in the medium for causing the computer to perform steps of:
(a) receiving as input a system design including a design under timing analysis, an external device, and an interface between the design under timing analysis and the external device;
(b) generating a timing model for the external device; and
(c) constructing a timing test harness for a static timing analysis tool from the timing model for the external device and the design under timing analysis.

Although the flowchart descriptions above are described and shown with reference to specific steps performed in a specific order, these steps may be combined, sub-divided, or reordered without departing from the scope of the claims. Unless specifically indicated herein, the order and grouping of steps is not a limitation of other embodiments that may lie within the scope of the claims.

The specific embodiments and applications thereof described above are for illustrative purposes only and do not preclude modifications and variations that may be made thereto by those skilled in the art within the scope of the following claims.

What is claimed is:

1. A method comprising steps of:
(a) receiving as input a system design including a design under timing analysis, an external device, and an interface between the design under timing analysis and the external device;
(b) generating a timing model for the external device;
(c) constructing a timing test harness for a static timing analysis tool from the timing model for the external device and the design under timing analysis;
(d) receiving and extracting timing arc parameters for the external device;
(e) generating a STAMP timing model file script for the external device from the timing arc parameters according to a set of predefined timing rules; and
(f) generating as output the STAMP timing model file script for the external device.

2. The method of claim 1 further comprising a step of modeling the interface.

3. The method of claim 2 further comprising a step of modeling the interface to include at least one of a phase locked loop, a delay locked loop, and a board wire delay.

4. The method of claim 1 further comprising a step of loading and linking the timing test harness into a static timing analysis tool.

5. The method of claim 4 further comprising a step of simulating a master clock signal inside the design under timing analysis.

6. The method of claim 4 further comprising a step of setting additional timing constraints inside the timing model of the external device.

7. The method of claim 6 further comprising a step of including at least one of a false path and a multi-cycle path in the additional timing constraints.

8. The method of claim 5 further comprising a step of generating as output a timing report of timing critical points in the timing test harness.

9. The method of claim 1, step (b) further comprising steps of:
receiving as input a manufacturer's datasheet for the external device;

extracting the parameters and values from the manufacturer's datasheet for each timing arc parameter defined in the datasheet for the external device;

generating a STAMP timing model file script for the external device from the timing arc;

generating a STAMP timing model data file script for the external device from the values for each of the timing arc parameters extracted from the manufacturer's datasheet; and generating as output the STAMP timing model data file script for the external device.

10. A computer readable storage medium tangibly embodying instructions for a computer that when executed by the computer implement a method comprising steps of:
(a) receiving as input a system design including a design under timing analysis, an external device, and an interface between the design under timing analysis and the external device;
(b) generating a timing model for the external device;
(c) constructing a timing test harness for a static timing analysis tool from the timing model for the external device and the design under timing analysis;
(d) receiving and extracting timing arc parameters for the external device;
(e) generating a STAMP timing model file script for the external device from the timing arc parameters according to a set of predefined timing rules; and
(f) generating as output the STAMP timing model file script for the external device.

11. The computer readable storage medium of claim 10 further comprising a step of modeling the interface.

12. The computer readable storage medium of claim 11 further comprising a step of modeling the interface to include at least one of a phase locked loop, a delay locked loop, and a board wire delay.

13. The computer readable storage medium of claim 10 further comprising a step of loading and linking the timing test harness into a static timing analysis tool.

14. The computer readable storage medium of claim 13 further comprising a step of simulating a master clock signal inside the design under timing analysis.

15. The computer readable storage medium of claim 13 further comprising a step of setting additional timing constraints inside the timing model of the external device.

16. The computer readable storage medium of claim 15 further comprising a step of including at least one of a false path and a multi-cycle path in the additional timing constraints.

17. The computer readable storage medium of claim 14 further comprising a step of generating as output a timing report of timing critical points in the timing test harness.

18. The computer readable storage medium of claim 10, further comprising steps of:
receiving as input a manufacturer's datasheet for the external device;
extracting the parameters and values from the manufacturer's datasheet for each timing arc parameter defined in the datasheet for the external device;
generating a STAMP timing model file script for the external device from the timing arc parameters according to a set of predefined timing rules;
generating a STAMP timing model data file script for the external device from the values for each of the timing arc parameters extracted from the manufacturer's datasheet; and
generating as output the STAMP timing model data file script for the external device.

* * * * *